(12) United States Patent
Watanabe et al.

(10) Patent No.: US 10,607,843 B2
(45) Date of Patent: Mar. 31, 2020

(54) METHOD OF MANUFACTURING A SEMICONDUCTOR DEVICE, AND A SEMICONDUCTOR SUBSTRATE

(71) Applicant: TOSHIBA MEMORY CORPORATION, Tokyo (JP)

(72) Inventors: Shinya Watanabe, Yokkaichi Mie (JP); Keisuke Taira, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/907,928

(22) Filed: Feb. 28, 2018

(65) Prior Publication Data

US 2019/0088493 A1    Mar. 21, 2019

(30) Foreign Application Priority Data

Sep. 15, 2017  (JP) ................. 2017-178231

(51) Int. Cl.
*H01L 21/306* (2006.01)
*H01L 23/544* (2006.01)
(Continued)

(52) U.S. Cl.
CPC .... *H01L 21/30608* (2013.01); *H01L 21/0337* (2013.01); *H01L 21/31144* (2013.01); *H01L 23/544* (2013.01); *H01L 27/1157* (2013.01); *H01L 27/11573* (2013.01); *H01L 27/11575* (2013.01); *H01L 27/11582* (2013.01); *B81C 2203/051* (2013.01); *H01L 22/34* (2013.01); *H01L 27/11556* (2013.01); *H01L 2223/5446* (2013.01); *H01L 2223/54426* (2013.01)

(58) Field of Classification Search
CPC .......... H01L 21/30608; H01L 21/0337; H01L 23/544; H01L 27/11556; H01L 27/11582; H01L 223/54426; B81C 203/051
See application file for complete search history.

(56) References Cited

U.S. PATENT DOCUMENTS 7,349,140 B2    3/2008  Yang
8,299,584 B2   10/2012  Shneyder et al.
(Continued)

FOREIGN PATENT DOCUMENTS

JP    2015-170841 A    9/2015

*Primary Examiner* — Zandra V Smith
*Assistant Examiner* — Andre C Stevenson
(74) *Attorney, Agent, or Firm* — Kim & Stewart LLP

(57) ABSTRACT

According to one embodiment, there is provided a method of manufacturing a semiconductor device which includes forming an alignment mark in a planned cutting line region of a first surface of a semiconductor substrate, forming a stacked structure above the first surface of the semiconductor substrate, removing the portion of the stacked structure present above the alignment mark, aligning the substrate in the lithography process, by causing infrared light to pass through the semiconductor substrate from a second surface thereof which is on a side opposite to the first surface thereof and performing positional alignment for exposure of a resist pattern based on the location of the alignment mark using infrared light reflected from the alignment mark, and exposing the resist, opening a pattern in the exposed resist, and further processing the semiconductor substrate using the resist pattern.

11 Claims, 16 Drawing Sheets

(51) Int. Cl.
*H01L 21/311* (2006.01)
*H01L 27/11582* (2017.01)
*H01L 21/033* (2006.01)
*H01L 27/11575* (2017.01)
*H01L 27/1157* (2017.01)
*H01L 27/11573* (2017.01)
*H01L 27/11556* (2017.01)
*H01L 21/66* (2006.01)

(56) References Cited

U.S. PATENT DOCUMENTS

| | | |
|---|---|---|
| 9,431,321 B2 | 8/2016 | Watanabe et al. |
| 2007/0189661 A1* | 8/2007 | Nakashiba ............... B32B 15/08 385/14 |
| 2008/0093424 A1* | 4/2008 | Kumar ............... B23K 35/0222 228/245 |
| 2013/0048979 A1* | 2/2013 | Piper ....................... H01L 28/24 257/48 |
| 2013/0057840 A1* | 3/2013 | Timoshkov ............ B82Y 10/00 355/66 |
| 2016/0216613 A1* | 7/2016 | Lin ....................... G03F 9/7084 |
| 2017/0084506 A1* | 3/2017 | Wang ................. G03F 7/70633 |
| 2017/0271207 A9* | 9/2017 | Purushothaman ............................ H01L 21/76898 |

\* cited by examiner

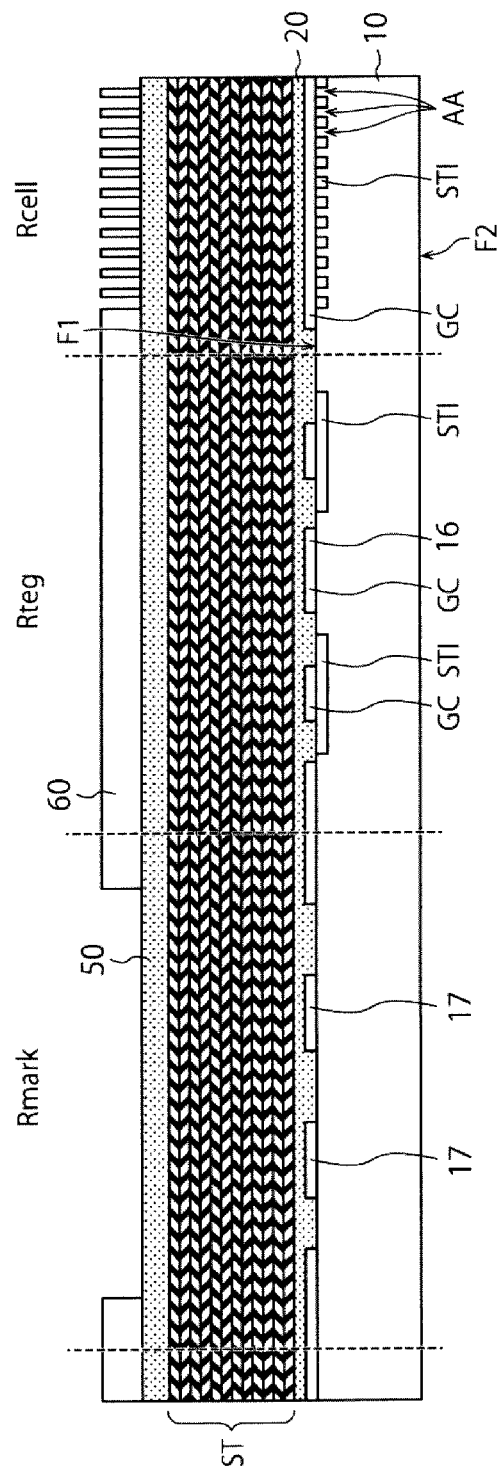
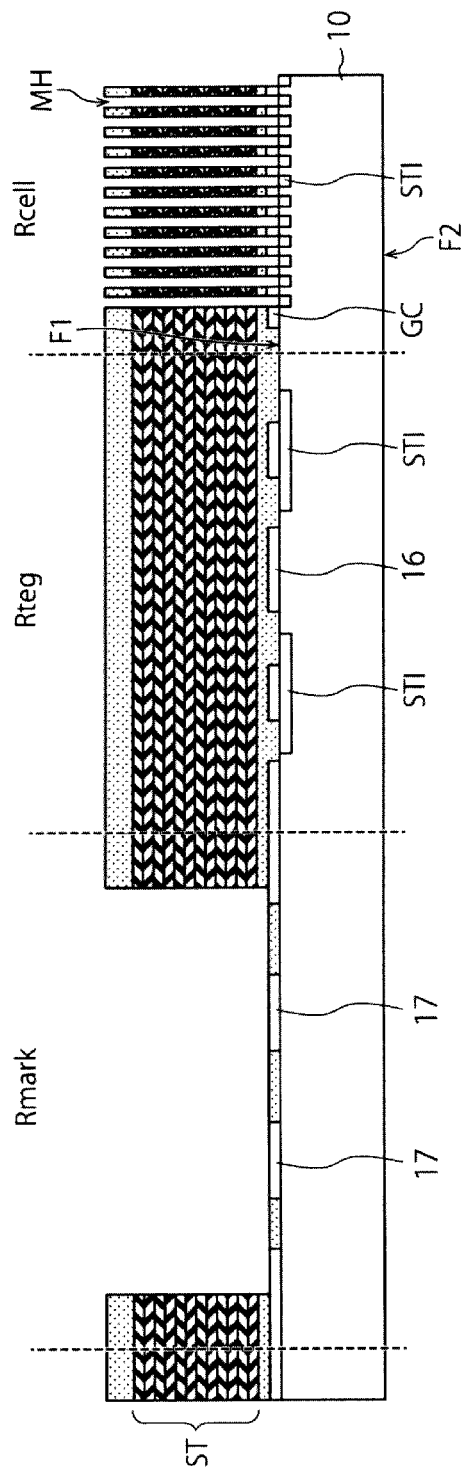

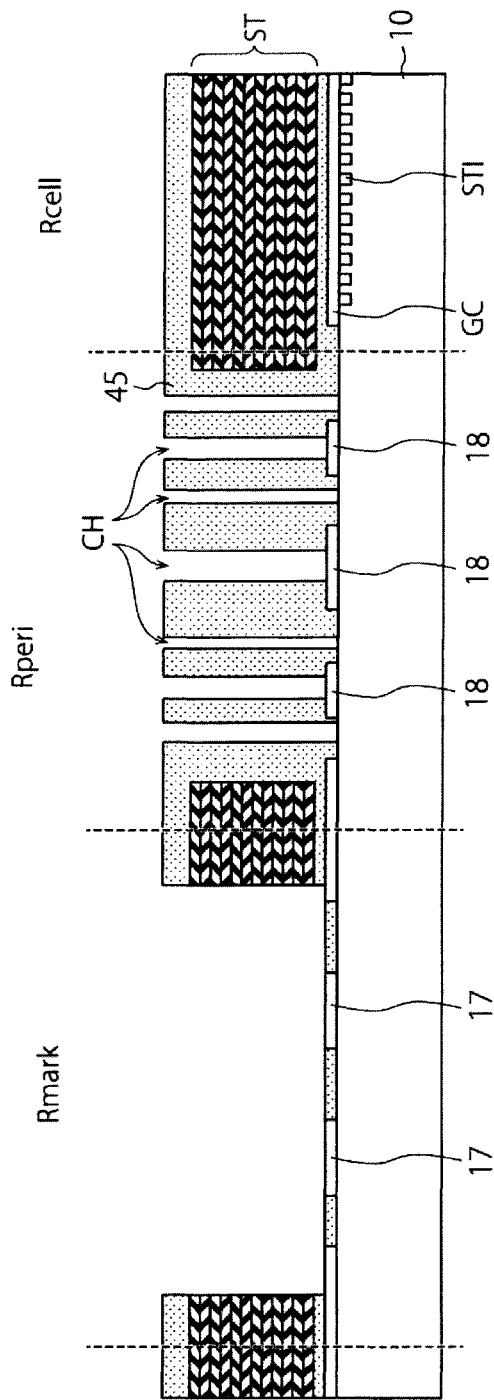

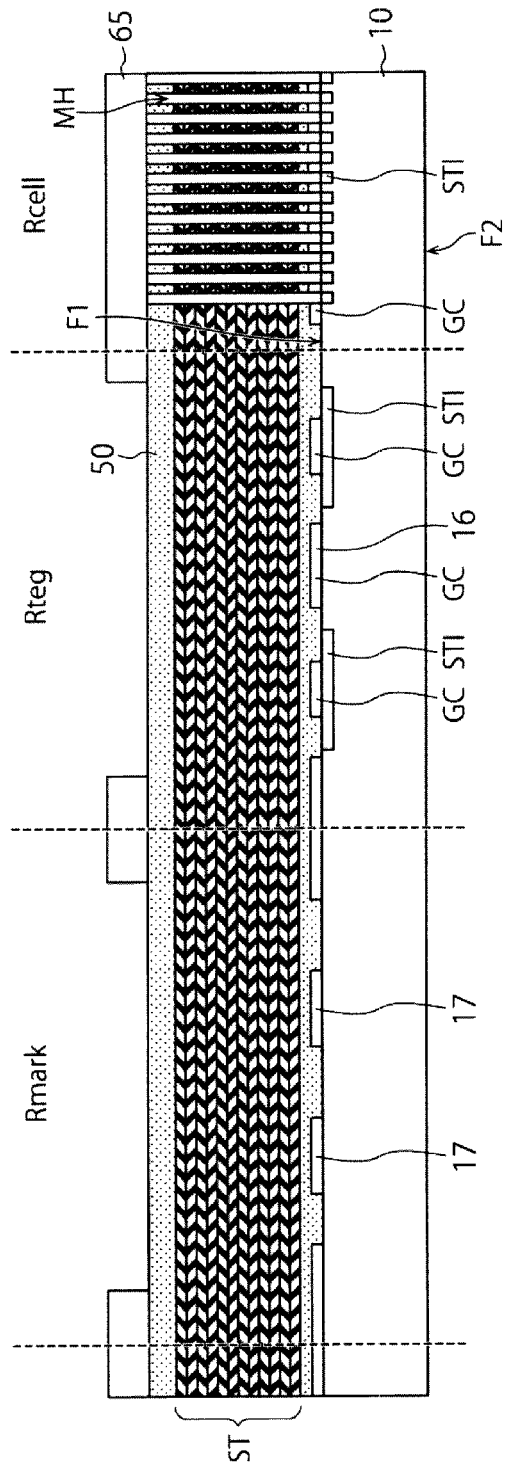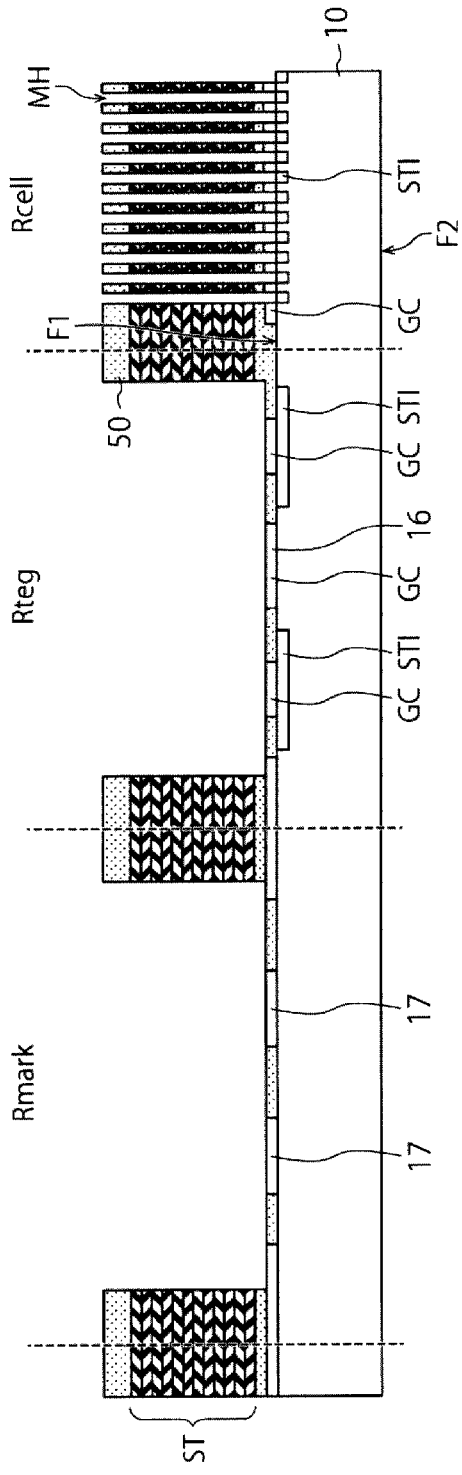

METHOD OF MANUFACTURING A SEMICONDUCTOR DEVICE, AND A SEMICONDUCTOR SUBSTRATE

CROSS-REFERENCE TO RELATED APPLICATION

This application is based upon and claims the benefit of priority from Japanese Patent Application No. 2017-178231, filed Sep. 15, 2017, the entire contents of which are incorporated herein by reference.

FIELD

Embodiments described herein relate generally to a method of manufacturing a semiconductor device, and a semiconductor substrate.

BACKGROUND

Semiconductor chips such as semiconductor memories may be stacked from a viewpoint of high functionality, high integration, and the like. A penetrating electrode called a through-silicon via (TSV) is used to electrically connect elements between the plurality of stacked semiconductor chips. The TSV penetrates through a semiconductor chip and is electrically connected to elements of other semiconductor chips.

The TSV is formed from the rear surface side of the semiconductor substrate after a semiconductor element is formed on a front surface side of the semiconductor substrate. In this case, in a lithography process, positional alignment needs to be performed from the rear surface side of the semiconductor substrate. Infrared light (IR) is used in order to visualize an alignment mark through the semiconductor substrate from the rear surface side of the semiconductor substrate.

DESCRIPTION OF THE DRAWINGS

FIG. 3 is a cross-sectional view illustrating an example of the method of manufacturing the semiconductor device, continued from FIG. 2.

FIG. 4 is a cross-sectional view illustrating the example of the method of manufacturing the semiconductor device, continued from FIG. 3.

FIG. 19 is a cross-sectional view illustrating an example of the method of manufacturing the semiconductor device, continued from FIG. 18.

FIG. 20 is a cross-sectional view illustrating an example of a method of manufacturing a semiconductor device according to a third embodiment.

FIG. 21 is a cross-sectional view illustrating an example of the method of manufacturing the semiconductor device, continued from FIG. 20.

DETAILED DESCRIPTION

Figure 1:
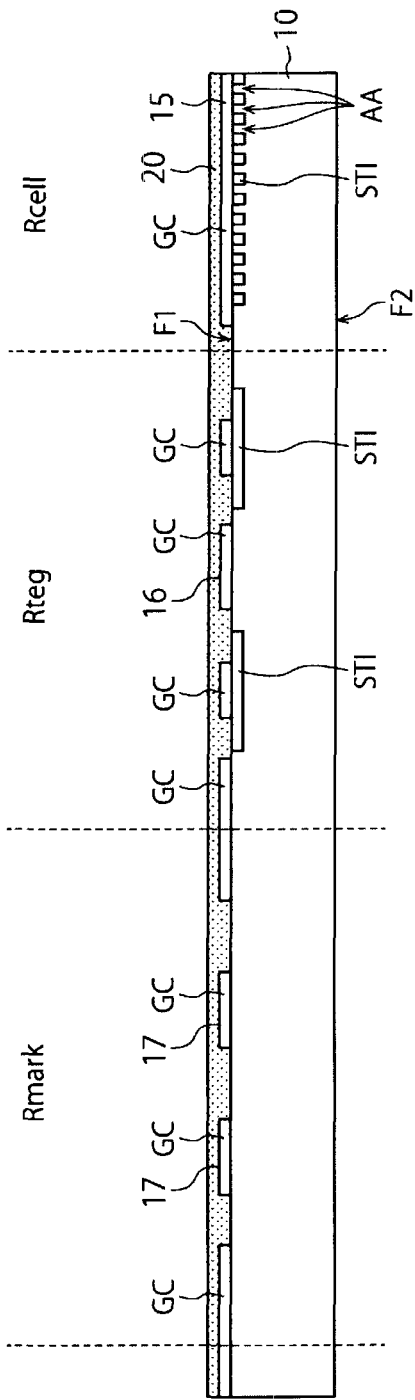
FIG. 1 is a cross-sectional view illustrating an example of a method of manufacturing a semiconductor device according to a first embodiment.

Embodiments provide a method of manufacturing a semiconductor device, and a semiconductor substrate, that are capable of improving signal strength from an alignment mark and facilitating positional alignment by using infrared light.

In general, according to one embodiment, a method of manufacturing a semiconductor device includes forming an alignment mark in a planned cutting line region of a first surface of a semiconductor substrate, forming a stacked structure above the first surface of the semiconductor substrate, removing the portion of the stacked structure present above the alignment mark, aligning the substrate in the lithography process, by causing infrared light to pass through the semiconductor substrate from a second surface thereof which is on a side opposite to the first surface thereof and performing positional alignment for exposure of a resist pattern based on the location of the alignment mark using infrared light reflected from the alignment mark, and exposing the resist, opening a pattern in the exposed resist, and further processing the semiconductor substrate using the resist pattern.

Hereinafter, embodiments of the present disclosure will be described with reference to the drawings. The embodiments do not limit the scope of the present disclosure. In the following embodiments, a vertical direction of a semiconductor substrate indicates a relative direction in a case where a front surface on which a semiconductor element is regarded as, or a rear surface which is opposite to the surface of the surface is regarded as, upward, and may be different from a vertical direction according to gravitational acceleration. The drawings are schematic or conceptual ones, and a ratio of each portion is not necessarily the same as those of an actual device. In the specification and drawings, elements similar to those described above with reference to drawing figures already illustrated are assigned the same reference numerals, and repeated detailed description thereof will be omitted as appropriate.

First Embodiment

FIGS. 1 to 11 are cross-sectional views illustrating an example of a method of manufacturing a semiconductor device according to a first embodiment. The semiconductor device may be, for example, a semiconductor memory having a NAND electrically erasable and programmable read-only memory (EEPROM) or the like. A memory cell array of the semiconductor memory may be a three-dimensionally stacked memory cell array. After being singulated into semiconductor chips, the semiconductor chips are stacked one over the other. In this case, a TSV (not illustrated) is used to electrically connect elements of a plurality of stacked semiconductor chips. The TSV is an electrode formed so as to penetrate the semiconductor substrate 10.

In FIGS. 1 to 11, a semiconductor substrate 10 is illustrated showing a memory cell region Rcell, a test pattern region Rteg, and an alignment mark region Rmark. The memory cell region Rcell is a region where a memory cell array MCA is formed as an element structure. The test pattern region Rteg is a region where a test pattern equivalent to a semiconductor element 15 formed in the memory cell region Rcell or another peripheral circuit (not illustrated) is formed. The test pattern is used to inspect electrical characteristics of the semiconductor element 15 in an inspection process. The alignment mark region Rmark is a region where an alignment mark used for performing positional alignment in the lithography process is formed. The alignment mark is a pattern used for performing positional alignment of a resist pattern in a lithography process when the TSV is formed.

The test pattern region Rteg and the alignment mark region Rmark are provided in a dicing line location (planned cutting line) on a first surface F1 of the semiconductor substrate 10, such as a semiconductor wafer. However, the test pattern region Rteg and the alignment mark region Rmark do not remain on the semiconductor chip after they are singulated from the wafer by dicing.

First, as illustrated in FIG. 1, a shallow trench isolation (STI) is formed on the first surface F1 of the semiconductor substrate 10 to define an active area AA. The semiconductor substrate 10 is not singulated at this stage. The semiconductor substrate 10 is, for example, a silicon substrate. The STI material is, for example, a silicon oxide film.

Next, the semiconductor element 15 is formed in the active area AA. The semiconductor element 15 may be, for example, a transistor, a resistor element, a capacitor element or the like. The semiconductor element 15 is configured with a diffusion layer (not illustrated) formed in the active area AA and a gate electrode GC or the like formed on the first surface F1 of the semiconductor substrate 10. For the gate electrode GC, for example, a conductor such as doped polysilicon is used. Simultaneously with formation of the semiconductor element 15, a test pattern 16 in the test pattern region Rteg is also formed. The gate electrode GC material is also used as an alignment mark 17 in the alignment mark region Rmark. Accordingly, the material to form the gate electrode GC is processed in a lithography process and an etching process to simultaneously form the alignment mark 17 as well as the gate electrode GC of the semiconductor element 15 and the test pattern 16. The semiconductor element 15, the test pattern 16, and the alignment mark 17 are covered with an interlayer insulating film 20.

Figure 2:
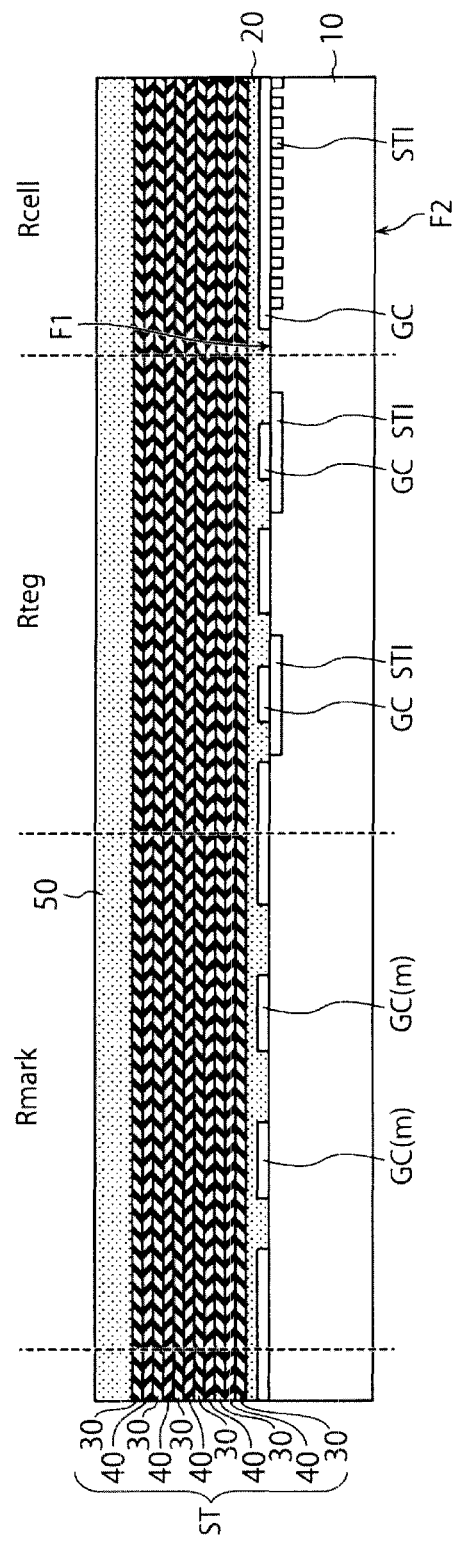
FIG. 2 is a cross-sectional view illustrating the example of the method of manufacturing the semiconductor device, continued from FIG. 1.

Next, as illustrated in FIG. 2, a plurality of first insulating films 30 and second insulating films 40 are alternately stacked on the interlayer insulating film 20 and a stacked structure ST is formed above the first surface F1 of the semiconductor substrate 10. The first insulating film 30 and the second insulating film 40 are insulating films having different materials from each other. The first insulating film 30 is, for example, a silicon oxide film or the like and the second insulating film 40 is, for example, a silicon nitride film or the like. The second insulating film 40 is selectively etchable with respect to the first insulating film 30 and is replaced with metal (not illustrated) which becomes a word line in a later process. The first insulating film 30 remains in order to electrically insulate a plurality of later-formed word lines adjacent to each other in a stacking direction.

Next, an insulating film 50 functioning as a hard mask is formed on the stacked structure ST of the first and second insulating films 30 and 40. The insulating film 50 is, for example, an insulating film such as a silicon oxide film.

Next, as illustrated in FIG. 3, a resist 60 is coated on the insulating film 50 and the resist 60 is patterned, using a lithography technique. The resist 60 is processed into a pattern of memory holes in the memory cell region Rcell. In the alignment mark region Rmark, the resist 60 is removed so as to open the region where the alignment mark 17 is provided.

Next, as illustrated in FIG. 4, the insulating film 50 is processed based on the pattern of the resist 60 using an etching technique (for example, a reactive ion etching (RIE) method). Furthermore, after the resist 60 is removed, the stacked structure ST is processed by an etching technique using the insulating film 50 as a mask. With this, memory holes MH are formed in the memory cell region Rcell and at the same time, the stacked structure (first and second insulating films 30 and 40) above the alignment mark 17 is removed in the alignment mark region Rmark.

Figure 5:
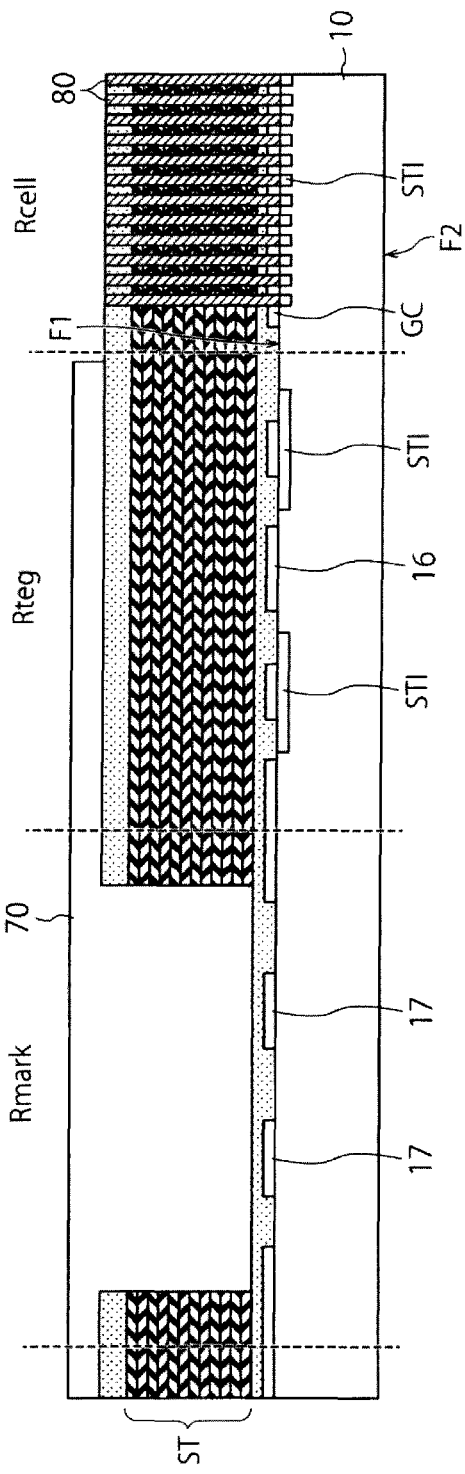
FIG. 5 is a cross-sectional view illustrating the example of the method of manufacturing the semiconductor device, continued from FIG. 4.
Figure 11:
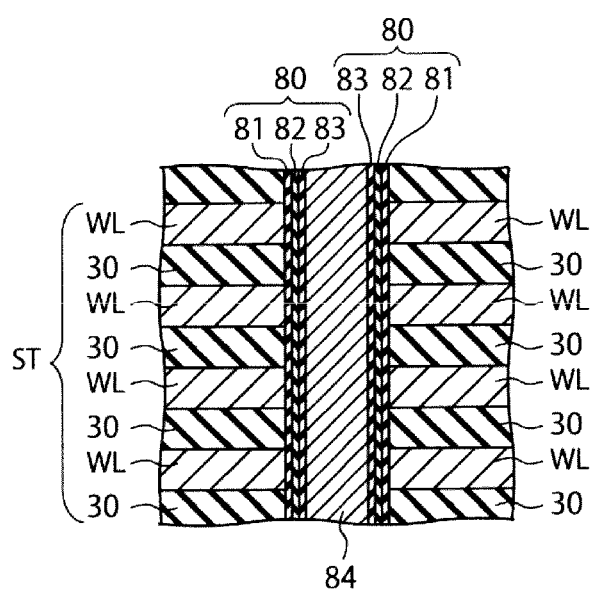
FIG. 11 is a cross-sectional view illustrating the example of the method of manufacturing the semiconductor device, continued from FIG. 10.

Next, as illustrated in FIG. 5, the alignment mark region Rmark and test pattern region Rteg are covered with a resist 70 using the lithography technique. Then, a block film 81, a charge storage layer 82, a gate insulating film 83, and a silicon body 84 are formed in the memory hole MH of the memory cell region Rcell (see FIG. 11). Hereinafter, the block film 81, the charge storage layer 82, the gate insulating film 83, and the silicon body 84 are collectively referred to as a memory structure 80. FIG. 11 is an enlarged view illustrating an example of a configuration of the inside of the memory hole MH. As illustrated in FIG. 11, the memory structure 80 is formed within the memory hole MH. As described above, the second insulating film 40 is replaced with a conductive material such as metal or polysilicon which functions as a word line WL. FIG. 11 illustrates a structure after the second insulating film 40 is replaced with the word line WL.

The silicon body 84 functions as a channel. The charge storage layer 82 functions as a data storing layer that accumulates charges injected from the silicon body 84 via the gate insulating film 83. The block film 81 restrain charges accumulated in the charge storage layer 82 from diffusing into the word line.

After the resist 70 is removed, a slit (not illustrated) is formed between the memory holes MH and the second insulating film 40 is removed via the slit, by using the lithography technique and the etching technique. With this, a recess portion is formed between the first insulating films 30 adjacent to each other in the stacking direction. The material of the word line is buried in the recess portion so as to form the word line WL. That is, as illustrated in FIG. 11, the second insulating film 40 is replaced with the word line WL. The material of the word line WL is, for example, doped polysilicon and a conductive material such as metal. Removal of the stacked structure ST above the alignment mark 17 may be performed when the slit is formed in the memory cell region Rcell. The slit is formed so as to penetrate through the stacked structure ST similarly to the memory hole MH and thus, removal of the stacked structure ST can also be performed simultaneously with formation of the slit.

Figure 6:
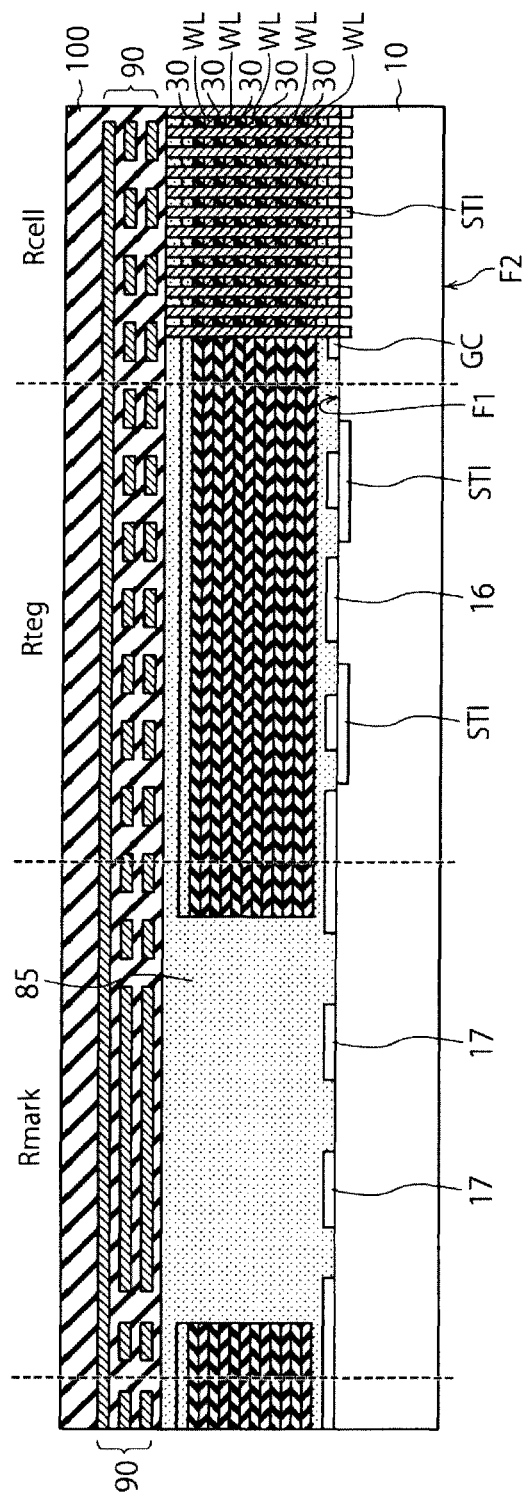
FIG. 6 is a cross-sectional view illustrating the example of the method of manufacturing the semiconductor device, continued from FIG. 5.

Next, the alignment mark region Rmark and the slit are filled with an insulating film 85. The insulating film 85 may be, for example, a silicon oxide film formed with tetraethylorthosilicate (TEOS) or the like. Furthermore, as illustrated in FIG. 6, a multilayer wiring layer 90 and a protective film 100 are formed. For the multilayer wiring layer 90, for example, metal such as copper, aluminum, or the like is used. The multilayer wiring layer 90 is not patterned in the alignment mark region Rmark but is provided above the alignment mark 17 as a whole.

Figure 7:
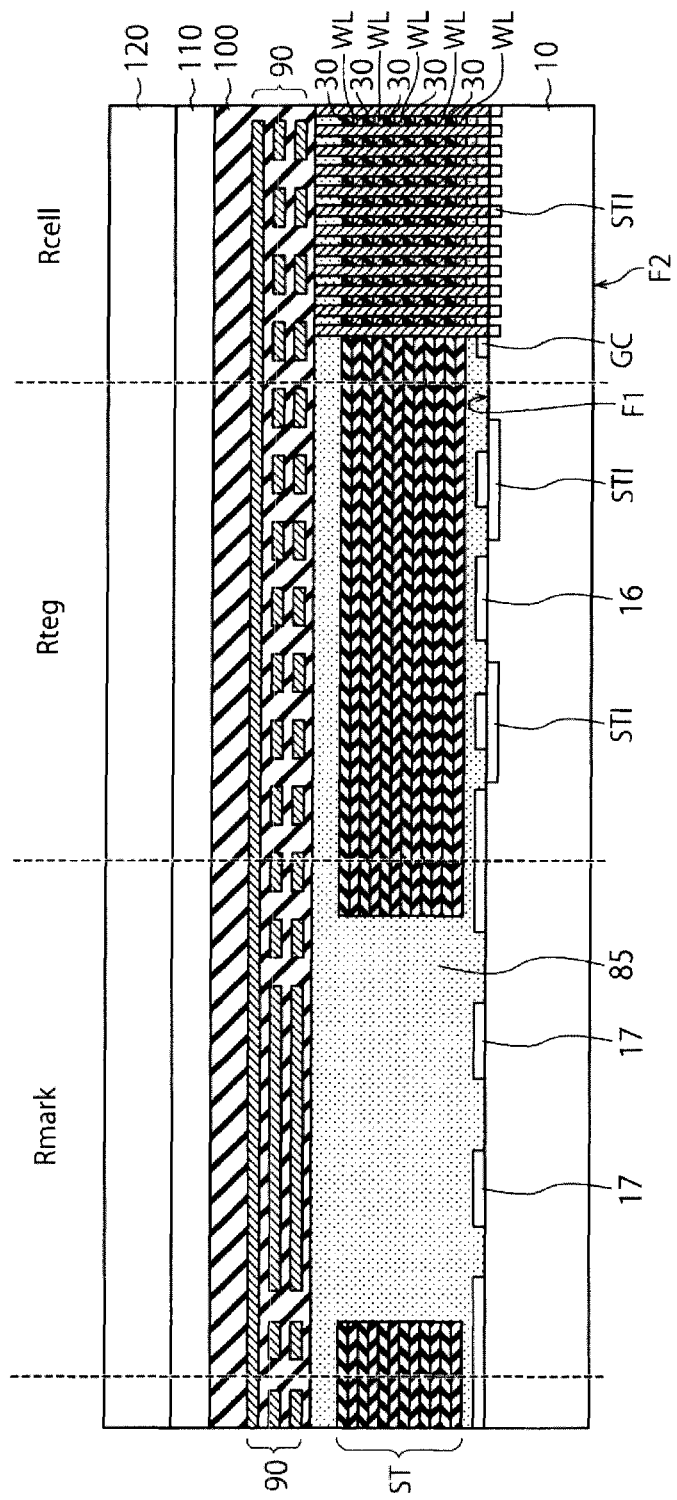
FIG. 7 is a cross-sectional view illustrating the example of the method of manufacturing the semiconductor device, continued from FIG. 6.

Next, a TSV formation process is started. As illustrated in FIG. 7, in order to polish a second surface F2 of the semiconductor substrate 10, an adhesive 110 is attached onto the protective film 100 and a supporting substrate 120 is bonded adhered to the first surface F1 side of the semiconductor substrate 10.

Figure 8:
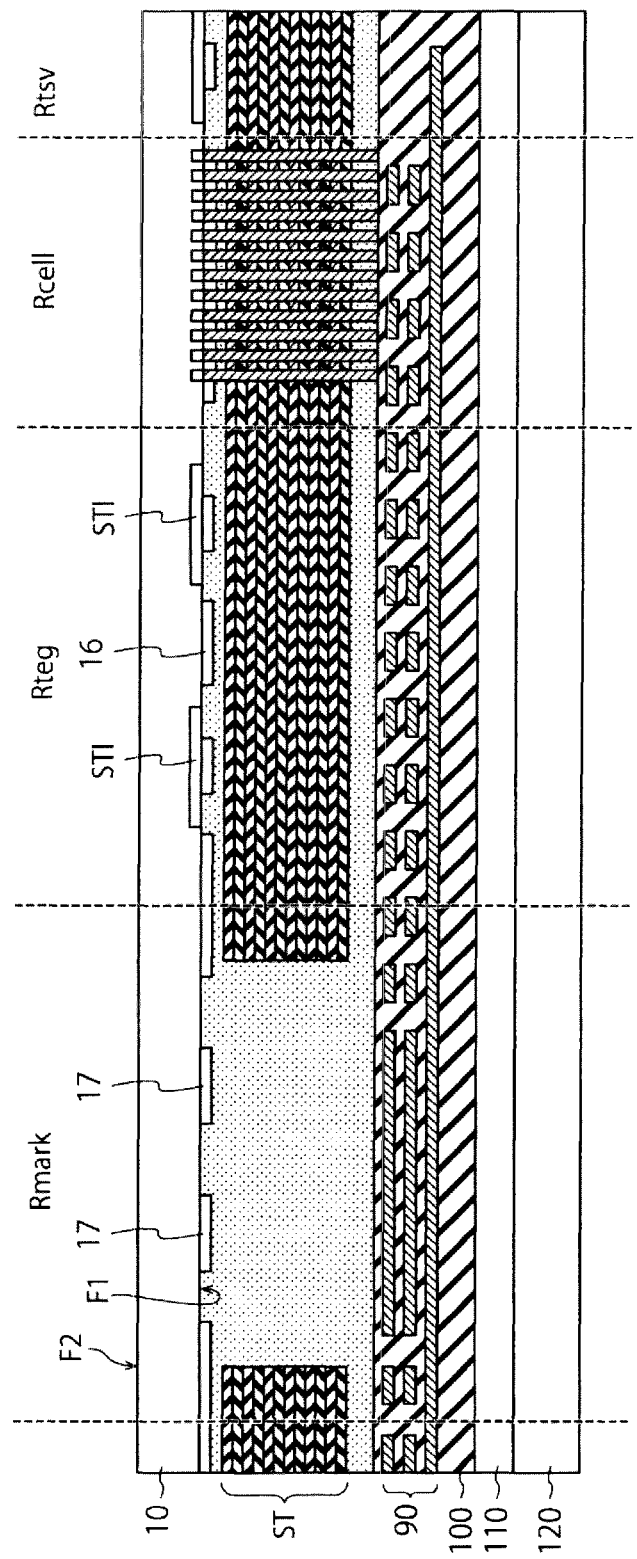
FIG. 8 is a cross-sectional view illustrating the example of the method of manufacturing the semiconductor device, continued from FIG. 7.

Next, as illustrated in FIG. 8, the semiconductor substrate 10 illustrated in FIG. 7 is turned upside down. With this, the second surface F2 of the semiconductor substrate 10 can be polished. The semiconductor substrate 10 is polished until the semiconductor substrate 10 has a predetermined thickness (for example, 20 to 40 μm). After FIG. 8, a TSV formation region Rtsv is shown so that TSV formation can be easily understood. As will be described later, the TSV is formed as an electrode penetrating from the second surface F2 of the semiconductor substrate 10 to the first surface F1 in the TSV formation region Rtsv.

Figure 9:
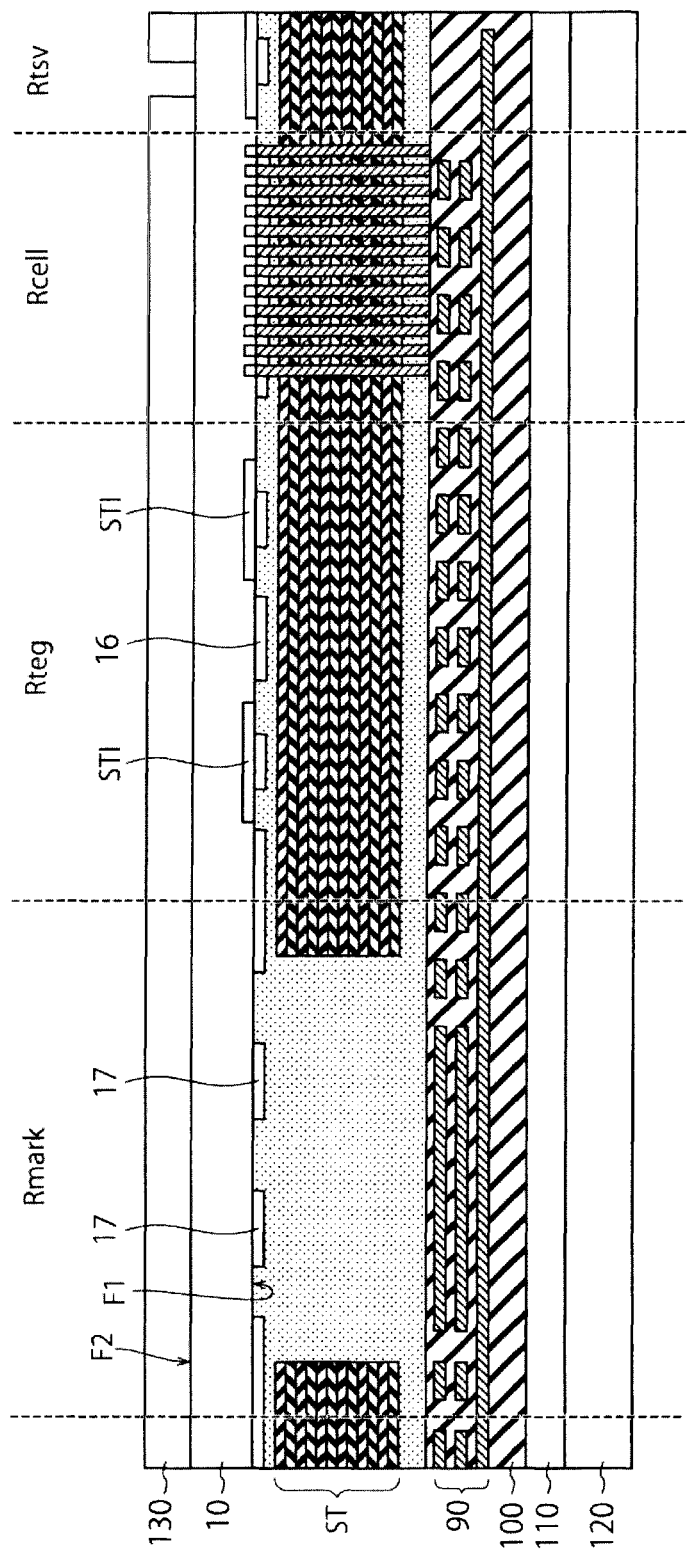
FIG. 9 is a cross-sectional view illustrating the example of the method of manufacturing the semiconductor device, continued from FIG. 8.

After the semiconductor substrate 10 is polished, as illustrated in FIG. 9, a resist 130 having a TSV formation region opening therethrough is formed by the lithography technique.

Here, in the lithography process, an exposure apparatus causes infrared light to pass through the second surface F2 of the semiconductor substrate 10 and uses reflected light from the alignment mark 17 to perform positional alignment based on the location of the alignment mark 17. Infrared light can pass through, for example, a silicon substrate of approximately 40 μm and reflected light reflected from the alignment mark 17 can also pass through the silicon substrate. Accordingly, by using infrared light, it is possible to detect the alignment mark 17 and perform positional alignment in the lithography process.

When the stacked structure ST is present below the alignment mark 17, infrared light reaches the stacked structure ST and is irregularly reflected by the stacked structure ST. With this, an intensity difference (contrast) between reflected light beams of infrared light becomes small (unclear) at an end portion the alignment mark 17. In this case, it becomes difficult to accurately determine a position of the end portion of the alignment mark 17 and it becomes difficult to accurately perform positional alignment using the alignment mark 17.

In contrast, in the manufacturing method according to the first embodiment, the stacked structure ST present above the alignment mark 17 is removed, as illustrated in FIG. 4. That is, the stacked structure ST is not present below the alignment mark 17 when seen from the second surface F2. Thus, infrared light is not highly irregularly reflected by the stacked structure ST, and a signal intensity difference (contrast) between reflected light beams of infrared light becomes relatively large (clear) at the end portion of the alignment mark 17. With this, it becomes easy to accurately determine the position of the end portion of the alignment mark 17 and it is possible to clearly recognize the end portion. In this case, it is possible to perform accurate positional alignment using the alignment mark 17. As a result, in the lithography process, it is possible to accurately expose the resist 130 to accurately align a layout pattern of the resist 130. It is thus possible to form the TSV at an accurate position by aligning the layout pattern of the resist 130.

Figure 10:
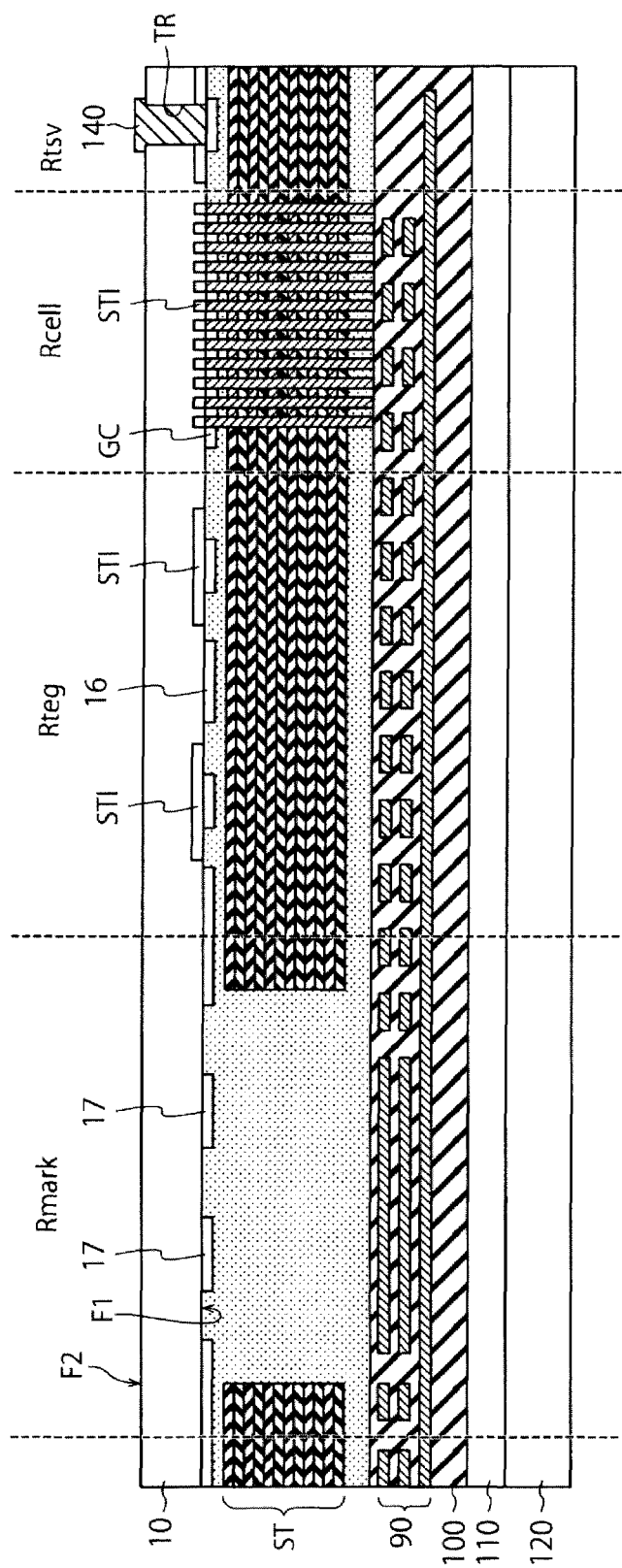
FIG. 10 is a cross-sectional view illustrating the example of the method of manufacturing the semiconductor device, continued from FIG. 9.

Next, as illustrated in FIG. 10, the semiconductor substrate 10 is processed according to the pattern of the resist 130 to form a trench TR penetrating from the second surface F2 of the semiconductor substrate 10 to the first surface F1. Furthermore, a metal material is filled into the trench TR. With this, a TSV 140 is formed. Metal bumps are formed on the TSV 140 as needed.

Thereafter, the supporting substrate 120 and the adhesive 110 are removed. The semiconductor wafer 10 is attached to a dicing tape and diced by a dicing blade or a dicing laser. With this, the semiconductor wafer is singulated into semiconductor chips (not illustrated). Thereafter, the semiconductor chips are stacked on a mounted substrate, packaged with resin and thus, the semiconductor device is completed.

As described above, in the manufacturing method according to the first embodiment, the stacked structure ST above the alignment mark 17 is removed. Accordingly, infrared light is not highly irregularly reflected by the stacked structure ST and the contrast between reflected light beams of infrared light is high and the position of the end portion of the alignment mark 17 is clearly distinguished from its surroundings. With this, signal intensity from the alignment mark 17 can be improved and accurate positional alignment of the TSV can be facilitated. As a result, reliability and yield of the semiconductor device can be improved.

In the alignment mark region Rmark, the multilayer wiring layer 90 is not patterned with the memory holes and thus remains as a whole. Accordingly, irregular reflection of infrared light is further reduced and the contrast between reflected light beams becomes clearer at the end portion of the alignment mark 17.

Semiconductor Wafer

Figure 12:
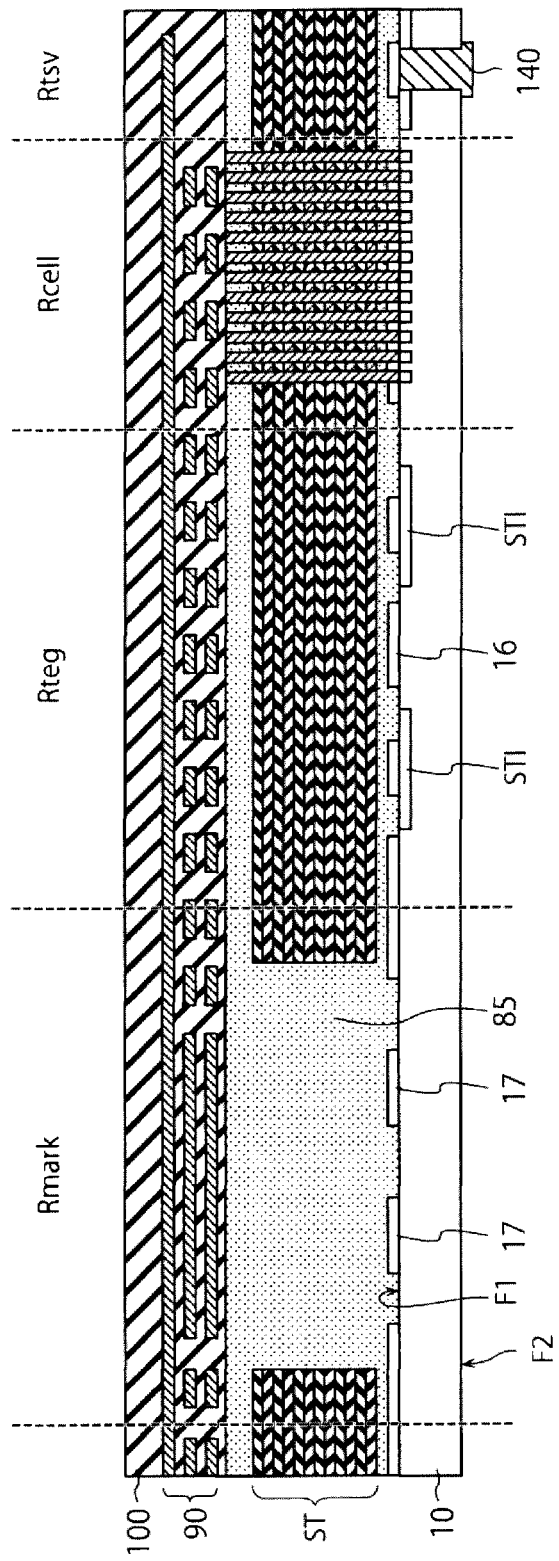
FIG. 12 is a cross-sectional view illustrating a configuration example of a semiconductor substrate according to the first embodiment.

FIG. 12 is a cross-sectional view illustrating a configuration example of a semiconductor wafer according to the first embodiment. A semiconductor wafer W according to the first embodiment includes the semiconductor substrate 10, the STI, the gate electrode GC, the test pattern 16, the alignment mark 17, the stacked structure ST, the multilayer wiring layer 90, and the TSV 140.

The semiconductor substrate 10 has the first surface F1 and the second surface F2 present on a side opposite to the first surface F1. The alignment mark 17 is provided in the alignment mark region Rmark used a dicing region of the first surface F1 of the semiconductor substrate 10. The alignment mark 17 is provided in the same layer as the gate electrode GC of the semiconductor element 15 and is formed of the same material (for example, doped polysilicon) as the gate electrode GC.

The stacked structure ST is provided above the memory cell region Rcell of the first surface F1 of the semiconductor substrate 10. On the other hand, the stacked structure ST is not provided above the alignment mark 17. With this, in the lithography process for forming the TSV 140, intensity difference (contrast) between reflected light beams of infrared light becomes clear at the end portion of the alignment mark 17 and the position of the end portion of the alignment mark 17 can be accurately determined. As a result, the TSV 140 can be accurately positioned and formed.

Line Width of Alignment Mark 17

Figure 13:
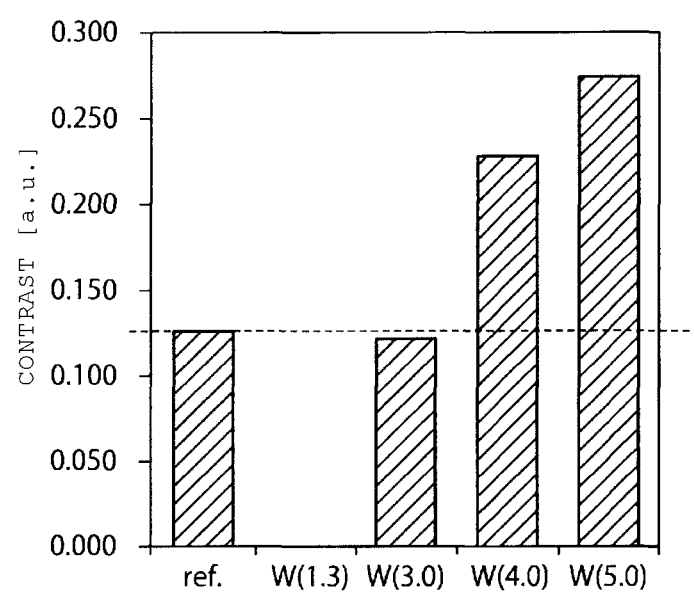
FIG. 13 is a graph illustrating a relationship between a line width of an alignment mark and a contrast between reflected light beams of infrared light.

FIG. 13 is a graph illustrating a relationship between the line width of the alignment mark 17 and a contrast between reflected light beams of infrared light. The bar labelled "ref." indicates the contrast in the case where the stacked structure ST is provided on the alignment mark 17. A line width of the alignment mark 17 of the ref. is approximately 4.0 µm. The line width is a width in a direction substantially perpendicular to a longitudinal direction of the alignment mark 17.

The bars associated with W(1.3) to W(5.0) indicate a contrast of a semiconductor wafer according to the first embodiment which does not have the stacked structure ST on the alignment mark 17. The bar (non-bar) of W(1.3) indicates the contrast of the alignment mark 17 having a line width of approximately 1.3 µm. The bar of W(3.0) indicates the contrast of the alignment mark 17 having a line width of approximately 3.0 µm. The bar of W(4.0) indicates the contrast of the alignment mark 17 having a line width of approximately 4.0 µm. The bar of W(5.0) indicates the contrast of the alignment mark 17 having a line width of approximately 5.0 µm.

In a case where the line width of the alignment mark 17 is approximately 3.0 µm or less, the contrast of the alignment mark 17 is smaller than the contrast of the ref. This means that when the line width of the alignment mark 17 is too small, it becomes difficult to perform positional alignment in the lithography process even when the stacked structure ST is not present over the alignment mark 17.

When the line width of the alignment mark 17 is approximately 4.0 µm or more, the contrast of the alignment mark 17 is substantially larger than the contrast of the ref. This means that positional alignment in the lithography process becomes easier by removing the stacked structure ST on the alignment mark 17 and setting the line width of the alignment mark 17 to be equal to or larger than approximately 4.0 µm. Accordingly, it is preferable to set the line width of the alignment mark 17 to be approximately 4.0 µm or more. A planar layout of the alignment mark 17 is not particularly limited.

Modification Example 1

Figure 14:
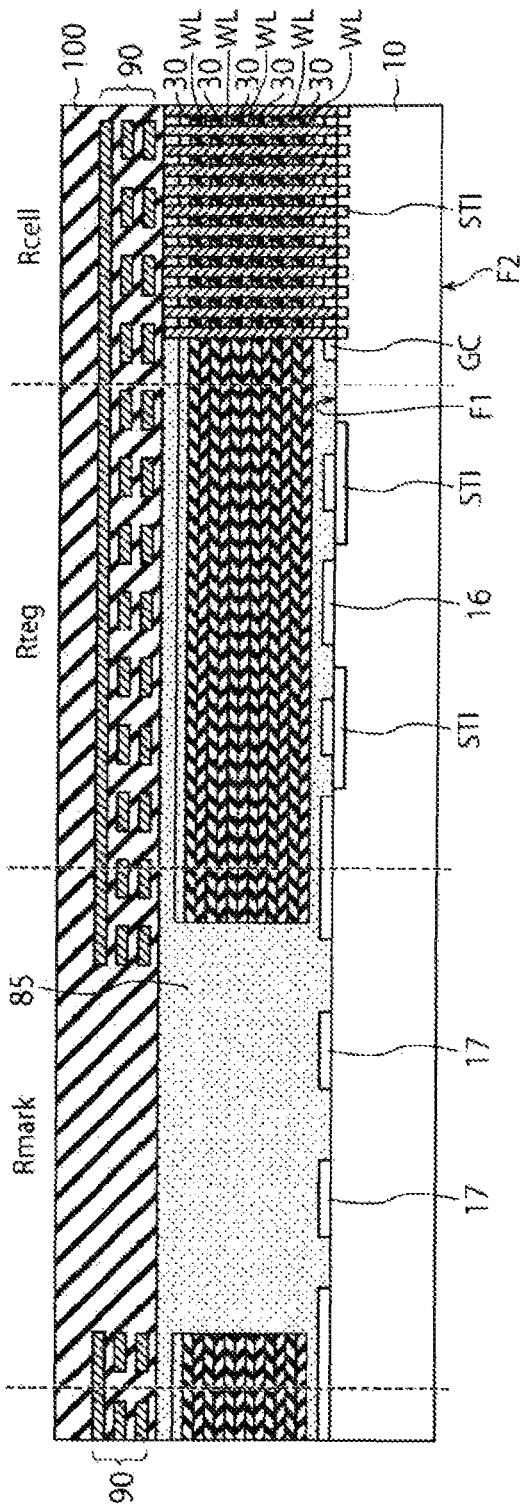
FIG. 14 is a cross-sectional view illustrating an example of a method of manufacturing a semiconductor device according to Modification example 1 of the first embodiment.

FIG. 14 is a cross-sectional view illustrating an example of a method of manufacturing a semiconductor device according to Modification example 1 of the first embodiment. After the processes illustrated in FIGS. 1 to 5 are performed similarly to the first embodiment, in Modification example 1, the multilayer wiring layer 90 above the alignment mark 17 illustrated in FIG. 6 is removed. As such, when the multilayer wiring layer 90 is removed, irregular reflection of infrared light is further reduced and the contrast of the reflected light becomes more clear at the end of the alignment mark 17. With this, the TSV 140 can be more accurately positioned and formed.

In the method of manufacturing the semiconductor device according to Modification example 1, in FIG. 7 to FIG. 11, the multilayer wiring layer 90 in the alignment mark region Rmark may be removed. Accordingly, illustration of cross sections corresponding to FIGS. 7 to 11 is omitted here.

Figure 15:
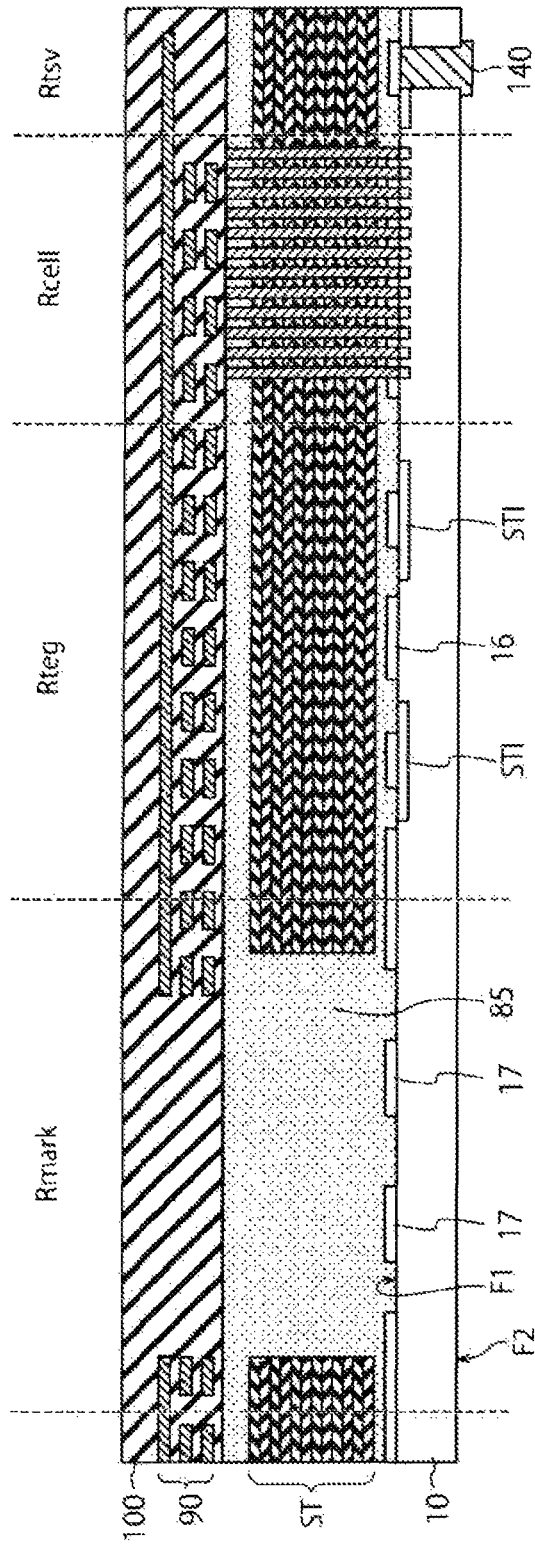
FIG. 15 is a cross-sectional view illustrating an example of a semiconductor substrate according to Modification example 1 of the first embodiment.

FIG. 15 is a cross-sectional view illustrating an example of a semiconductor wafer according to Modification example 1 of the first embodiment. In the semiconductor wafer according to Modification example 1, the multilayer wiring layer 90 may be removed from the semiconductor wafer illustrated in FIG. 12. With this, the TSV 140 can be more accurately positioned and formed. A configuration of the semiconductor wafer according to Modification example 1 may be the same as the corresponding configuration of the semiconductor wafer illustrated in FIG. 12.

Modification Example 2

Figure 16:
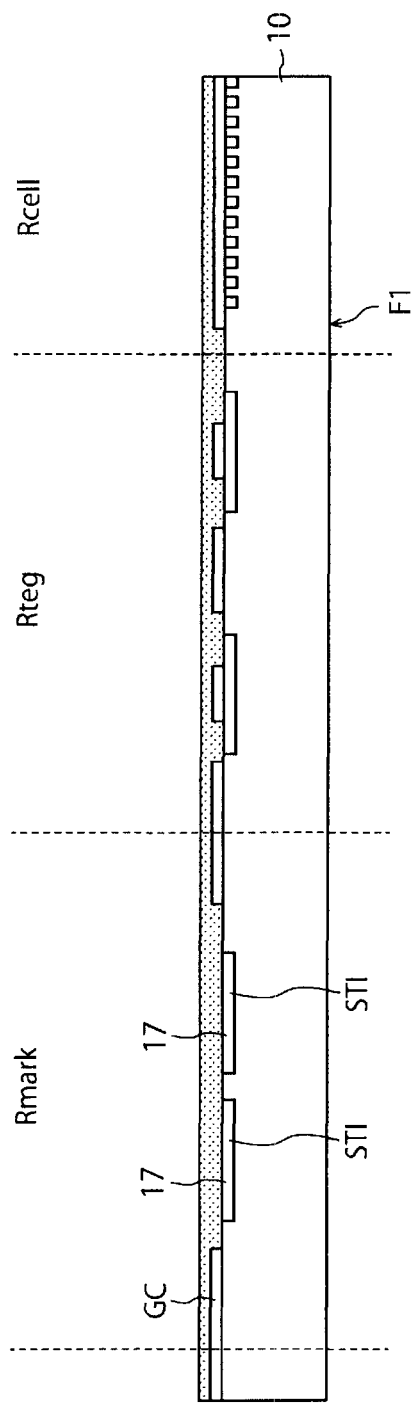
FIG. 16 is a cross-sectional view illustrating an example of a method of manufacturing a semiconductor device according to Modification example 2 of the first embodiment.

FIG. 16 is a cross-sectional view illustrating an example of a method of manufacturing a semiconductor device according to Modification example 2 of the first embodiment. In Modification example 2, as illustrated in FIG. 16, the alignment mark 17 is different from the first embodiment in that the alignment mark 17 is not formed of the gate electrode GC material, but formed of a portion of the STI material. The other manufacturing processes of Modification example 2 may be the same as the manufacturing processes of the first embodiment. As such, even when the alignment mark 17 is configured with the STI, effect of the first embodiment is not lost.

Figure 17:
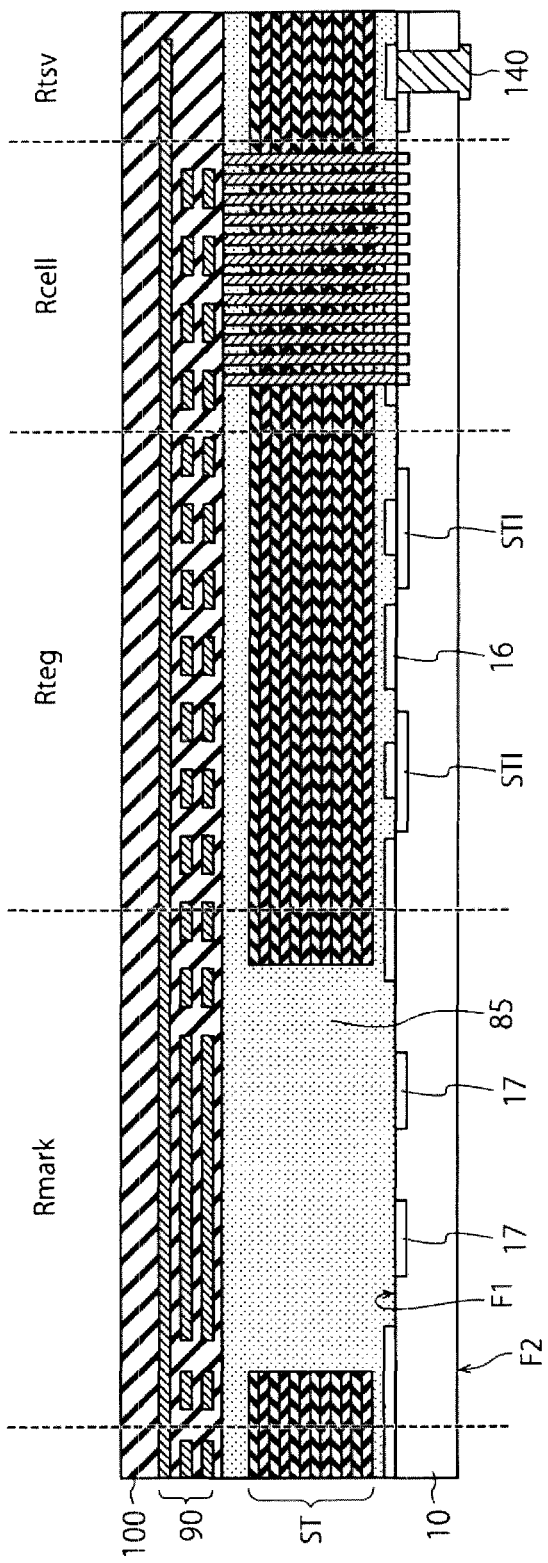
FIG. 17 is a cross-sectional view illustrating an example of a semiconductor substrate according to Modification example 2 of the first embodiment.

FIG. 17 is a cross-sectional view illustrating an example of a semiconductor wafer according to Modification example 2 of the first embodiment. The semiconductor wafer according to Modification example 2 is different from the first embodiment in that the alignment mark 17 is not formed of the gate electrode GC, but formed of the STI. Other configurations of Modification example 2 may be the same as corresponding configurations of the first embodiment. As such, even when the alignment mark 17 is configured with the STI, effect of the first embodiment is not lost.

Modification example 2 may be combined with Modification Example 1.

Second Embodiment

Figure 18:
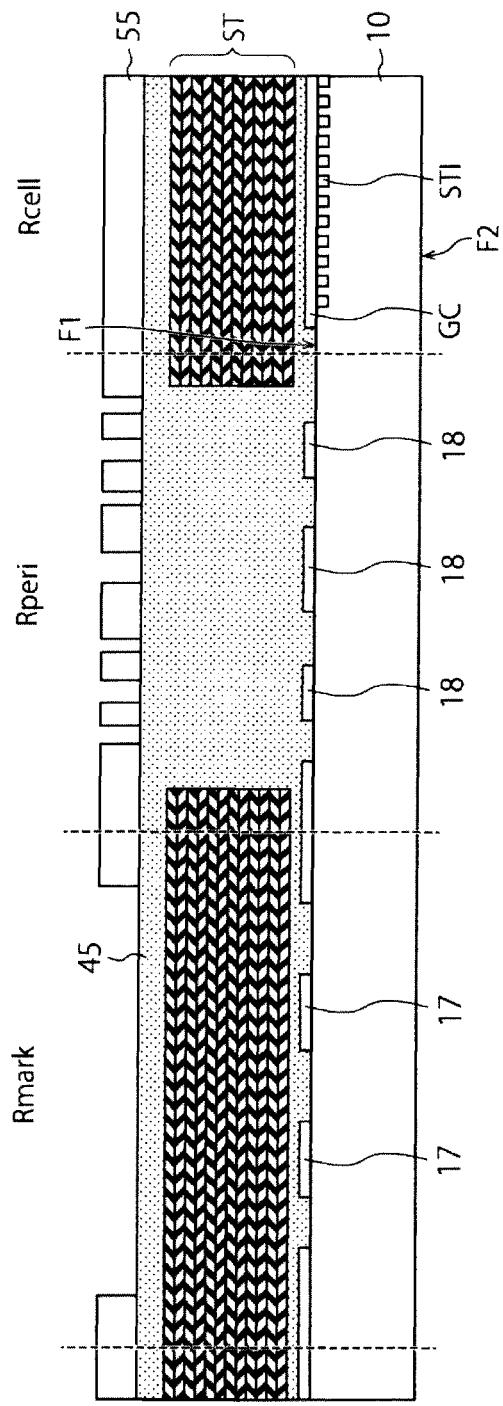
FIG. 18 is a cross-sectional view illustrating an example of a method of manufacturing a semiconductor device according to a second embodiment.

FIGS. 18 and 19 are cross-sectional views illustrating an example of a method of manufacturing a semiconductor device according to a second embodiment. In the first embodiment, the stacked structure ST above the alignment mark 17 is removed in the process of forming the memory hole MH or the slit. In contrast, in the second embodiment, the stacked structure ST above the alignment mark 17 is removed in the process of forming a contact of a peripheral circuit. In FIGS. 18 and 19, a peripheral circuit region Rperi is shown instead of the test pattern region Rteg, for the sake of convenience.

First, after the processes illustrated in FIGS. 1 and 2, the stacked structure ST is removed in the peripheral circuit region Rperi using the lithography technique and the etching technique.

Next, as illustrated in FIG. 18, an interlayer insulating film 45 is formed in the peripheral circuit region Rperi and over the cell region Rcell and the alignment mark region Rreg. The interlayer insulating film 45 is, for example, an insulating film such as a silicon oxide film. The reference numeral 18 denotes a semiconductor element formed in the peripheral circuit region Rperi.

Next, a resist 55 is formed on the interlayer insulating film 45 by the lithography technique. The resist 55 is patterned into a layout of a contact hole to form a contact reaching the semiconductor element of the peripheral circuit region Rperi. The resist 55 in the overall alignment mark region Rmark is also removed.

Next, as illustrated in FIG. 19, the interlayer insulating film 45 is processed and the stacked structure ST of the alignment mark region Rmark is removed by an etching technique using the resist 55 as a mask. With this, in the peripheral circuit region Rperi, a contact hole CH reaching the gate electrode GC or the semiconductor substrate 10 is formed. In the alignment mark region Rmark, the stacked structure ST above the alignment mark 17 is removed.

Next, although not illustrated, using the lithography technique, the alignment mark region Rmark is covered with a resist, the contact hole CH in the peripheral circuit region Rperi is filled with a metal material and the contact is formed.

Thereafter, as illustrated in FIG. 3 to FIG. 5, the stacked structure ST of the memory cell region Rcell is processed. In this case, the stacked structure ST of the alignment mark region Rmark has already been removed. Accordingly, the memory cell region Rcell is processed in a state where the alignment mark region Rmark is protected with the resist.

Furthermore, after FIG. 6, the same process as in the first embodiment is carried out to complete the semiconductor device.

As such, the stacked structure ST above the alignment mark 17 may be removed in the process of forming the contact of the peripheral circuit. With this, in the manufacturing method according to the second embodiment, it is possible to form the same semiconductor device as that in the first embodiment. Accordingly, in the second embodiment, it is possible to obtain the same effect as in the first embodiment.

Third Embodiment

FIGS. 20 and 21 are cross-sectional views illustrating an example of a method of manufacturing a semiconductor device according to a third embodiment. In the third embodiment, the stacked structure ST above the alignment mark 17 is simultaneously removed in the process of removing the stacked structure ST of the test pattern region Rteg.

First, after the processes illustrated in FIGS. 1 and 2, the stacked structure ST of the memory cell region Rcell is processed by using the lithography technique and etching technique, as illustrated in FIGS. 3 and 4. In this case, the alignment mark region Rmark is covered with a resist 60.

Next, as illustrated in FIG. 20, a resist 65 is formed on the insulating film 50 by using a lithography technique. The resist 65 is patterned so as to open the overall test pattern region Rteg in order to remove the stacked structure ST of the test pattern region Rteg. The resist 65 is patterned so as to open the overall alignment mark region Rmark in order to remove the stacked structure ST above the alignment mark 17.

Next, as illustrated in FIG. 21, the insulating film 50 is processed by using the resist 65 as a mask by the etching technique, and the stacked structure ST of the test pattern region Rteg and the alignment mark region Rmark is removed using the insulating film 50 as a mask.

Although not illustrated, the test pattern region Rteg and the alignment mark region Rmark are covered with the resist using the lithography technique and as illustrated in FIG. 5, the memory structure 80 is formed in the memory hole MH of the memory cell region Rcell.

Thereafter, after FIG. 6, the same processes as in the first embodiment are performed to complete the semiconductor device.

As such, the stacked structure ST above the alignment mark 17 may be removed at the same time in the process of removing the stacked structure ST of the test pattern region Rteg. With this, in the manufacturing method according to the third embodiment, it is possible to form the same semiconductor device as in the first embodiment. Accordingly, in the third embodiment, it is possible to obtain the same effect as in the first embodiment.

In the second and third embodiments, one or both of Modification example 1 and Modification example 2 may be combined. The alignment mark 17 may be formed with the STI instead of the gate electrode GC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:

forming an alignment mark in a planned cutting line region of a first surface of a semiconductor substrate;

forming a test pattern on the first surface of the semiconductor substrate;

after the test pattern is formed, forming a stacked structure including first insulating films and second insulating films that are alternately stacked, above the first surface of the semiconductor substrate;

removing a portion of the stacked structure present above the alignment mark;

after said removing, filling a region from which the portion of the stacked structure is removed with a third insulating film;

after said filling with the third insulating film, attaching a support substrate on a side of the first surface of the semiconductor substrate, and then thinning a second surface of the semiconductor substrate opposite to the first surface;

after said thinning, forming a resist on the thinned second surface, aligning the semiconductor substrate for a lithography process by causing infrared light to pass through the semiconductor substrate from the thinned second surface, and performing positional alignment for exposure of a resist pattern based on the location of the alignment mark using infrared light reflected from the alignment mark; and after said aligning the semiconductor substrate, exposing the resist, opening a pattern in the exposed resist to form the resist pattern, forming a trench penetrating the semiconductor substrate from the thinned second surface to the first surface using the resist pattern, and filling the trench with metal to form an electrode penetrating through the semiconductor substrate.

2. The method according to claim 1, wherein the portion of the stacked structure over the alignment mark is removed simultaneously with processing of the stacked structure present in an element forming region.

3. The method according to claim 1, further comprising:
forming a multilayer wiring layer over the stacked structure after the stacked structure is formed above the first surface of the semiconductor substrate; and
removing the portion of the multilayer wiring layer over the alignment mark.

4. The method according to claim 1, wherein the line width of the alignment mark is greater than or equal to 4 µm.

5. The method according to claim 1, further comprising:
simultaneously removing portions of the stacked structure over the test structure and over the alignment mark.

6. The method according to claim 1, further comprising:
forming a peripheral circuit on the first surface of the semiconductor substrate prior to forming the stacked structure on the semiconductor substrate; and
simultaneously removing portions of the stacked structure over the peripheral circuit and over the alignment mark.

7. The method according to claim 1, further comprising:
forming a shallow trench isolation structure by depositing a shallow trench isolation material over the first surface of the substrate and into openings extending inwardly of the first surface of the substrate; and
forming the alignment mark from the shallow trench isolation material.

8. The method according to claim 1, further comprising:
forming a gate structure by forming a gate material over the first surface of the substrate and etching the gate material to form individual gates; and
simultaneously etching the gate material to form the alignment mark.

9. A method of forming a semiconductor device, comprising:
providing a substrate having a first surface and a second surface opposite to the first surface;
forming an alignment mark on the first surface of the substrate;
forming a test pattern at a location thereon other than the position of the alignment mark on the first surface of the semiconductor substrate;
after the test pattern is formed, forming a plurality of stacked layers over the first surface of the substrate including over the alignment mark, the stacked layers including first insulating films and second insulating films that are alternately stacked;
removing a portion of the plurality of stacked layers located over the alignment mark;
after said removing, filling a region from which the portion of the plurality of stacked layers is removed with a third insulating film;
after said filling with the third insulating film, attaching a support substrate on a side of the first surface of the substrate, and then thinning the second surface of the substrate; and
after said thinning, forming a patterned mask layer over the thinned second surface of the substrate, using the alignment mark visualized through the substrate by an alignment system, to align the pattern of the mask layer, forming a trench penetrating the substrate from the thinned second surface to the first surface using the pattern of the mask layer, and filling the trench with metal to form an electrode penetrating through the substrate.

10. The method according to claim 9, further comprising:
removing a portion of the plurality of stacked layers located over the test pattern simultaneously with the removing of the portion of the plurality of stacked layers located over the alignment mark.

11. The method according to claim 9, further comprising:
forming a peripheral circuit on the first surface of the substrate at a location thereon other than the position of the alignment mark; and
removing a portion of the plurality of stacked layers located over the peripheral circuit simultaneously with the removing of the portion of the plurality of stacked layers located over the alignment mark.

* * * * *